(12) United States Patent
Agrawal et al.

(10) Patent No.: US 12,272,801 B2
(45) Date of Patent: Apr. 8, 2025

(54) EMOJI MANAGEMENT FOR ELECTRONIC MESSAGING

(71) Applicant: MOTOROLA MOBILITY LLC, Wilmington, DE (US)

(72) Inventors: Amit Kumar Agrawal, Bangalore (IN); Krishnan Raghavan, Bangalore (IN); Hariprasad Shanbhogue Alampady, Bangalore (IN)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 18/496,884

(22) Filed: Oct. 29, 2023

(65) Prior Publication Data
US 2024/0154925 A1    May 9, 2024

(30) Foreign Application Priority Data
Nov. 8, 2022   (EP) .................................... 22206104

(51) Int. Cl.
| G06F 15/16 | (2006.01) |
| G01R 31/36 | (2020.01) |
| H01M 10/42 | (2006.01) |
| H01M 10/48 | (2006.01) |
| H01M 50/242 | (2021.01) |
| H04L 51/10 | (2022.01) |
| G06F 3/04847 | (2022.01) |

(52) U.S. Cl.
CPC .... *H01M 10/4285* (2013.01); *G01R 31/3644* (2013.01); *H01M 10/486* (2013.01); *H01M 50/242* (2021.01); *H04L 51/10* (2013.01); *G06F 3/04847* (2013.01)

(58) Field of Classification Search
None
See application file for complete search history.

(56) References Cited

U.S. PATENT DOCUMENTS

2017/0263248 A1\* 9/2017 Gruber .................. G06F 40/166
2022/0394001 A1\* 12/2022 Cundall .............. H04M 1/7243

\* cited by examiner

*Primary Examiner* — Wing F Chan
*Assistant Examiner* — Andrew Woo
(74) *Attorney, Agent, or Firm* — Isidore PLLC (57) ABSTRACT

A method provides techniques for emoji management for electronic messaging. The message includes detecting, by a processor of an electronic device, selection of an emoji for sending within a message. A recipient is identified for the message. The method further includes determining one or more attributes that can be associated with the emoji, and retrieving at least one of a recipient emoji reception preference and a sender emoji transmission preference for the one or more attributes. The emoji is modified based on the one or more attributes corresponding to the at least one of the recipient emoji reception preference and the sender emoji transmission preference. The method continues with transmitting the message with the modified emoji to the recipient.

20 Claims, 9 Drawing Sheets

EMOJI MANAGEMENT FOR ELECTRONIC MESSAGING

BACKGROUND

1. Technical Field

The present disclosure generally relates to electronic devices that support sending and receiving of electronic messages, and more specifically to electronic devices that support sending and receiving of electronic messages that include emojis.

2. Description of the Related Art

Emojis play a significant role in modern communication and have become an integral part of how people express themselves in digital conversations. Emojis allow people to convey emotions and sentiment in text-based communication, which can sometimes be challenging to do effectively. For example, a simple smiley face emoji can indicate happiness or friendliness, while a frowning face emoji can convey sadness or disappointment. Furthermore, emojis can add nuance and depth to communication. For example, someone might use a laughing face emoji to indicate they're joking, a heart emoji to express love or affection, or a 'face with rolling eyes' emoji to convey sarcasm or frustration. Moreover, people often use specific emojis that reflect their personality, style, or interests. This personalization can help create a sense of identity and authenticity in digital interactions. Emojis often reflect popular trends, memes, and cultural references. The inclusion of new emojis by organizations such as the Unicode Consortium keeps communication up to date with evolving cultural norms. Thus, emojis have many applications, and therefore are, and will likely continue to be, prevalent in electronic messaging communication.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

According to aspects of the present disclosure, an electronic device, a method, and a computer program product provides techniques for emoji management for electronic messaging. One or more embodiments enable the establishment of sender and/or recipient emoji preferences. The preferences can include preferred emoji attributes such as gesture attributes, color attributes, skin tone attributes, and so on. Based on the sender and/or recipient preferences, one or more embodiments change one or more attributes of a sent emoji prior to that emoji being received by a recipient or of a received emoji at the recipient's device. In one or more embodiments, the change in the one or more attributes occurs on an electronic device associated with a sender of an electronic message that includes an emoji. In one or more embodiments, the change in the one or more attributes occurs on an electronic device associated with a recipient of an electronic message that includes an emoji. Furthermore, one or more embodiments change one or more attributes of a sender-selected emoji in a composed message prior to that emoji being sent to a recipient.

One or more embodiments can include an electronic device comprising: a display; a memory having stored thereon at least one messaging application and an emoji management module for including instructions for controlling certain operations of the electronic device; a network interface which enables the electronic device to connect to, and exchange messages with, at least one second electronic device; and a processor communicatively coupled to the display, the memory, and the network interface, and which executes program code of the at least one messaging application and the emoji management module, which causes the electronic device to: detect selection of an emoji for sending within a message; identify a recipient for the message; determine one or more attributes that can be associated with the emoji; retrieve at least one of a recipient emoji reception preference and a sender emoji transmission preference for the one or more attributes; modify the emoji based on the one or more attributes corresponding to the at least one of the recipient emoji reception preference and the sender emoji transmission preference; and transmit the message with the modified emoji to the recipient Misunderstandings of emojis in text messages due to cultural differences can lead to various problems and challenges in communication. Emojis are often used to convey emotions, but the same emoji may be interpreted differently in different cultures. For example, a thumbs-up emoji may signify approval in many cultures, and yet, the thumbs-up emoji can be considered offensive in some cultures. Without a shared understanding of the meaning, the recipient may misinterpret the sender's intended emotion. Furthermore, emojis can be ambiguous, and their meanings may not always align with cultural norms. Emojis that are considered playful or harmless in one culture might be seen as offensive or disrespectful in another. For instance, the "OK" hand gesture is generally seen as a positive signal in many Western cultures, but can be offensive in some countries and under some circumstances, can be interpreted as a vulgar gesture. Including such emojis in an electronic message can lead to unintentional insults or cultural insensitivity. In another example, the "peace sign" (a hand holding up two fingers) is widely recognized as a symbol of peace and positivity, but can have a different meaning when used in certain contexts. Additionally, emojis depicting people and body parts now include options for different skin tones and genders. While this is meant to promote inclusivity, emojis can also lead to misunderstandings if the sender's choice of skin tone or gender representation doesn't align with the recipient's expectations or cultural norms. While emojis can enhance communication, cultural and other differences amongst people can create situations where the use of emojis inadvertently causes misunderstandings or offensive reactions.

The disclosed embodiments mitigate the aforementioned problems by detecting sender and/or recipient emoji preferences. The preferences can include, but are not limited to, preferred gestures, preferred skin tones, an indication of emojis the user finds offensive, and so on. Emojis include in messages are compared with sender/recipient preferences. When a sender composes an electronic message using an emoji that conflicts with sender/recipient preferences, one or more embodiments provides that the device intercepts emoji data before the emoji is sent to or outputted to the recipient, and the device changes one or more emoji attributes to better align with the sender/recipient emoji preferences. Accordingly, disclosed embodiments can serve to improve electronic communication by minimizing confusion and reducing the risk of having an electronic message unintentionally interpreted as offensive.

The above descriptions contain simplifications, generalizations and omissions of detail and is not intended as a comprehensive description of the claimed subject matter but, rather, is intended to provide a brief overview of some of the functionality associated therewith. Other systems, methods, functionality, features, and advantages of the claimed subject matter will be or will become apparent to one with skill in the art upon examination of the figures and the remaining detailed written description. The above as well as additional objectives, features, and advantages of the present disclosure will become apparent in the following detailed description.

Each of the above and below described features and functions of the various different aspects, which are presented as operations performed by the processor(s) of the communication/electronic devices are also described as features and functions provided by a plurality of corresponding methods and computer program products, within the various different embodiments presented herein. In the embodiments presented as computer program products, the computer program product includes a non-transitory computer readable storage device having program instructions or code stored thereon, which enables the electronic device and/or host electronic device to complete the functionality of a respective one of the above-described processes when the program instructions or code are processed by at least one processor of the corresponding electronic/communication device, such as is described above.

In the following description, specific example embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from the general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one implementation (embodiment) of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various aspects are described which may be aspects for some embodiments but not for other embodiments.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element (e.g., a person or a device) from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be provided its broadest interpretation given the context in which that term is utilized.

Those of ordinary skill in the art will appreciate that the hardware components and basic configuration depicted in the following figures may vary. For example, the illustrative components within electronic device 100 (FIG. 1) are not intended to be exhaustive, but rather are representative to highlight components that can be utilized to implement the present disclosure. For example, other devices/components may be used in addition to, or in place of, the hardware depicted. The depicted example is not meant to imply architectural or other limitations with respect to the presently described embodiments and/or the general disclosure.

Throughout this disclosure, the terms 'electronic device', 'communication device', and 'electronic communication device' may be used interchangeably, and may refer to devices such as smartphones, tablet computers, and/or other computing/communication devices.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments.

Figure 1:
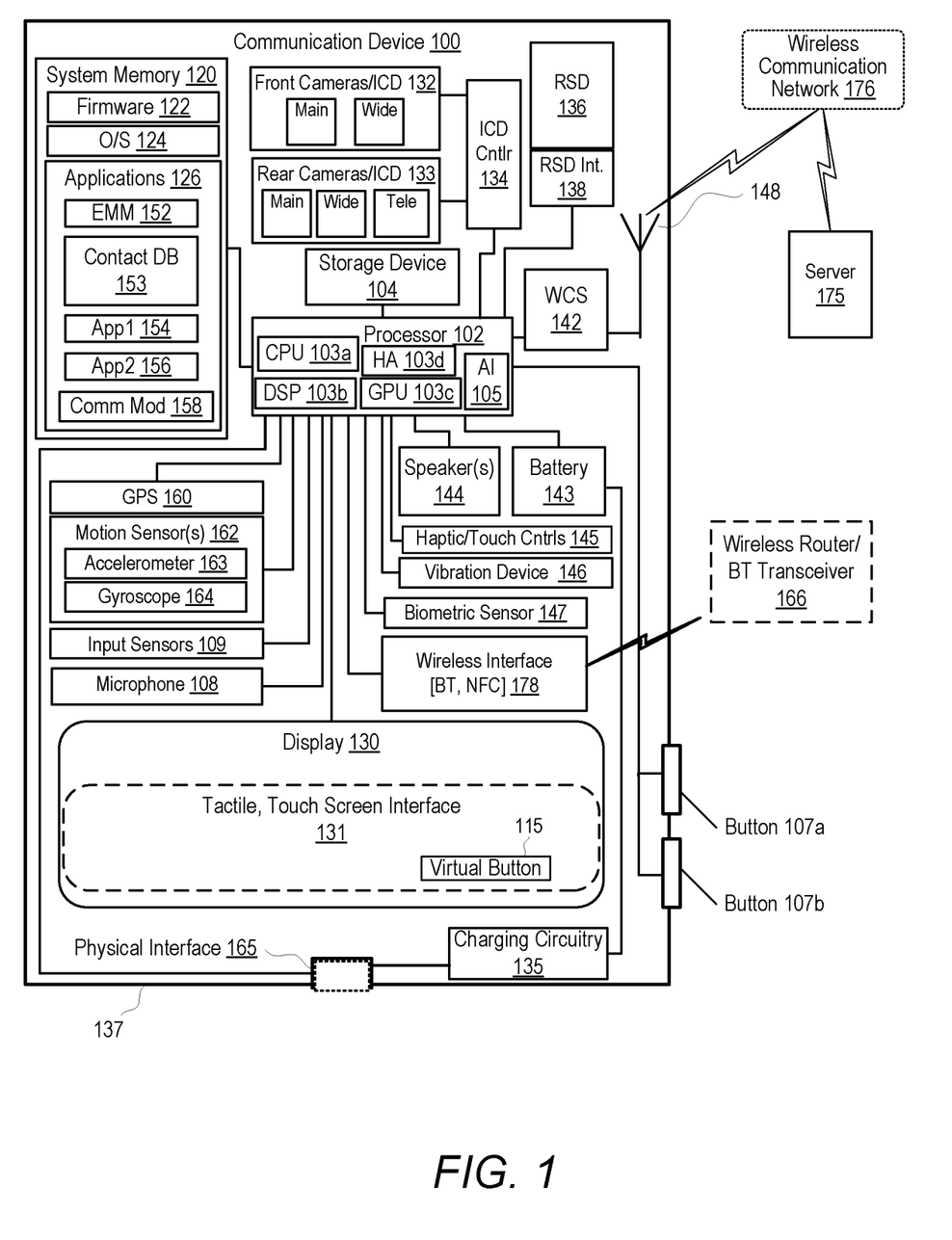
FIG. 1 depicts an example component makeup of a communication device with specific components used to enable the device to perform functions for emoji management, according to one or more embodiments.

Referring now to the figures and beginning with FIG. 1, there is illustrated an example component makeup of electronic device 100, within which various aspects of the disclosure can be implemented, according to one or more embodiments. Electronic device 100 includes specific components that enable the device to: detect selection of an emoji for sending within a message; identify a recipient for the message; determine one or more attributes that can be associated with the emoji; retrieve at least one of a recipient emoji reception preference and a sender emoji transmission preference for the one or more attributes; modify the emoji based on the one or more attributes corresponding to the at least one of the recipient emoji reception preference and the sender emoji transmission preference; and transmit the message with the modified emoji to the recipient. Examples of electronic device 100 include, but are not limited to, mobile devices, a notebook computer, a mobile phone, a smart phone, a digital camera with enhanced processing capabilities, a smart watch, a tablet computer, and other types of electronic device. It is appreciated that electronic device 100 can include other types of electronic devices that are capable of providing emoji management for electronic messaging.

Electronic device 100 includes processor 102 (typically as a part of a processor integrated circuit (IC) chip), which includes processor resources such as central processing unit (CPU) 103a, communication signal processing resources such as digital signal processor (DSP) 103b, graphics processing unit (GPU) 103c, and hardware acceleration (HA) unit 103d. In some embodiments, the hardware acceleration (HA) unit 103d may establish direct memory access (DMA) sessions to route network traffic to various elements within electronic device 100 without direct involvement from processor 102 and/or operating system 124. Processor 102 can interchangeably be referred to as controller 102.

Controller 102 can, in some embodiments, include image signal processors (ISPs) (not shown) and dedicated artificial intelligence (AI) engines 105. Controller 102 is communicatively coupled to storage device 104, system memory 120, input devices (introduced below), output devices, including integrated display 130, and image capture device (ICD) controller 134.

According to one or more embodiments, ICD controller 134 performs or supports functions such as, but not limited to, selecting and activating an active camera from among multiple cameras and adjusting the camera settings and characteristics (e.g., shutter speed, f/stop, ISO exposure, zoom control, field of view (FOV) angle, etc.) of the active camera. ICD controller 134 can perform these functions in response to commands received from processor 102 in order to control ICDs 132, 133 to capture video or still images of a local scene within a FOV of the operating/active ICD. Throughout the disclosure, the term image capturing device (ICD) is utilized interchangeably to be synonymous with and/or refer to any one of front or rear facing cameras 132, 133. Both sets of cameras 132, 133 include image sensors that can capture images that are within the field of view (FOV) of the respective ICD 132, 133.

In one or more embodiments, the functionality of ICD controller 134 is incorporated within processor 102, eliminating the need for a separate ICD controller. Thus, for simplicity in describing the features presented herein, the various camera selection, activation, and configuration functions performed by the ICD controller 134 are described as being provided generally by processor 102. Similarly, manipulation of captured images and videos are typically performed by GPU 103c and certain aspects of device communication via wireless networks are performed by DSP 103b, with support from CPU 103a. However, for simplicity in describing the features of the disclosure, the functionality provided by one or more of CPU 103a, DSP 103b, GPU 103c, and ICD controller 134 are collectively described as being performed by processor 102. Collectively, components integrated within processor 102 support computing, classifying, processing, transmitting and receiving of data and information, and presenting of graphical images within a display.

System memory 120 may be a combination of volatile and non-volatile memory, such as random-access memory (RAM) and read-only memory (ROM). System memory 120 can store program code or similar data associated with firmware 122, an operating system 124, and/or applications 126. During device operation, processor 102 processes program code of the various applications, modules, OS, and firmware, that are stored in system memory 120.

In accordance with one or more embodiments, applications 126 include, without limitation, emoji management module (EMM) 152, contact database 153, other applications, indicated as 154 and 156, and communication module 158. Each module and/or application provides program instructions/code that are processed by processor 102 to cause processor 102 and/or other components of electronic device 100 to perform specific operations, as described herein. Descriptive names assigned to these modules add no functionality and are provided solely to identify the underlying features performed by processing the different modules. For example, emoji management module 152 includes program instructions for facilitating storing and/or retrieving emoji preferences to/from contact database 153 and changing a sent and/or received emoji accordingly. Additionally, in one or more embodiments, program code of emoji management module 152 and contact database 153 enable effective presentation of emojis in electronic messages, thereby improving the efficiency of communication using emojis.

In one or more embodiments, electronic device 100 includes removable storage device (RSD) 136, which is inserted into RSD interface 138 that is communicatively coupled via system interlink to processor 102. RSD 136 may have a version of one or more of the applications (e.g., 152, 153, 154, 156, 158) and specifically emoji management module 152 and/or contact database 153 stored thereon. In one or more embodiments, RSD 136, with program code for EMM 152 and related applications or data stored thereon, is a non-transitory computer program product or computer readable storage device. Processor 102 can access RSD 136 to provision electronic device 100 with program code that, when executed/processed by processor 102, the program code causes or configures processor 102 and/or generally electronic device 100, to provide the various emoji management functions described herein.

Electronic device 100 includes an integrated display 130 which incorporates a tactile, touch screen interface 131 that can receive user tactile/touch input. As a touch screen device, integrated display 130 allows a user to provide input to or to control electronic device 100 by touching features within the user interface presented on display 130. Tactile, touch screen interface 131 can be utilized as an input device. The touch screen interface 131 can include one or more virtual buttons, indicated generally as 115. In embodiments, when a user applies a finger on the touch screen interface 131 in the region demarked by the virtual button 115, the touch of the region causes the processor 102 to execute code to implement a function associated with the virtual button. In some implementations, integrated display 130 is integrated into a front surface of electronic device 100 along with front ICDs, while the higher quality ICDs are located on a rear surface.

Electronic device 100 can further include microphone 108, one or more output devices such as speakers 144, and one or more input buttons, indicated as 107a and 107b. While two buttons are shown in FIG. 1, other embodiments may have more or fewer input buttons. Microphone 108 can also be referred to as an audio input device. In some embodiments, microphone 108 may be used for identifying a user via voiceprint, voice recognition, and/or other suitable techniques. Input buttons 107a and 107b may provide controls for volume, power, and ICDs 132, 133. Additionally, electronic device 100 can include input sensors 109 (e.g., sensors enabling gesture detection by a user).

Electronic device 100 further includes haptic touch controls 145, vibration device 146, fingerprint/biometric sensor 147, global positioning system (GPS) device 160, and motion sensor(s) 162. Vibration device 146 can cause electronic device 100 to vibrate or shake when activated. Vibration device 146 can be activated during an incoming call or message in order to provide an alert or notification to a user of electronic device 100. According to one aspect of the disclosure, integrated display 130, speakers 144, and vibration device 146 can generally and collectively be referred to as output devices.

Biometric sensor 147 can be used to read/receive biometric data, such as fingerprints, to identify or authenticate a user. In some embodiments, the biometric sensor 147 can supplement an ICD (camera) for user detection/identification.

GPS device 160 can provide time data and location data about the physical location of electronic device 100 using geospatial input received from GPS satellites. Motion sensor(s) 162 can include one or more accelerometers 163 and gyroscope 164. Motion sensor(s) 162 can detect movement of electronic device 100 and provide motion data to processor 102 indicating the spatial orientation and movement of electronic device 100. Accelerometers 163 measure linear acceleration of movement of electronic device 100 in multiple axes (X, Y and Z). Gyroscope 164 measures rotation or angular rotational velocity of electronic device 100. Electronic device 100 further includes a housing 137 (generally represented by the thick exterior rectangle) that contains/protects the components internal to electronic device 100.

Electronic device 100 also includes a physical interface 165. Physical interface 165 of electronic device 100 can serve as a data port and can be coupled to charging circuitry 135 and device battery 143 to enable recharging of device battery 143.

Electronic device 100 further includes wireless communication subsystem (WCS) 142, which can represent one or more front end devices (not shown) that are each coupled to one or more antennas 148. In one or more embodiments, WCS 142 can include a communication module with one or more baseband processors or digital signal processors, one or more modems, and a radio frequency (RF) front end having one or more transmitters and one or more receivers. Example communication module 158 within system memory 120 enables electronic device 100 to communicate with wireless communication network 176 and with other devices, such as server 175 and other connected devices, via one or more of data, audio, text, and video communications. Communication module 158 can support various communication sessions by electronic device 100, such as audio communication sessions, video communication sessions, text communication sessions, exchange of data, and/or a combined audio/text/video/data communication session.

WCS 142 and antennas 148 allow electronic device 100 to communicate wirelessly with wireless communication network 176 via transmissions of communication signals to and from network communication devices, such as base stations or cellular nodes, of wireless communication network 176. Wireless communication network 176 further allows electronic device 100 to wirelessly communicate with server 175 and other communication devices, which can be similarly connected to wireless communication network 176. In one or more embodiments, various functions that are being performed on communications device 100 can be supported using or completed via/on server 175.

Electronic device 100 can also wirelessly communicate, via wireless interface(s) 178, with wireless communication network 176 via communication signals transmitted by short range communication device(s) to and from an external WiFi router (or wireless transceiver device) 180, which is communicatively connected to wireless communication network 176. Wireless interface(s) 178 can be a short-range wireless communication component providing Bluetooth, near field communication (NFC), and/or wireless fidelity (Wi-Fi) connections. In one embodiment, electronic device 100 can receive Internet or Wi-Fi based calls, text messages, multimedia messages, and other notifications via wireless interface(s) 178. In one or more embodiments, electronic device 100 can communicate wirelessly with external wireless device 166, such as a WiFi router or BT transceiver, via wireless interface(s) 178. In an embodiment, WCS 142 with antenna(s) 148 and wireless interface(s) 178 collectively provide wireless communication interface(s) of electronic device 100.

The device 100 of FIG. 1 is only a specific example of devices that can be used with embodiments of the present invention. Devices that utilize disclosed embodiments can include, but are not limited to, a smartphone, a tablet computer, a laptop computer, a desktop computer, a wearable computer, and/or other suitable electronic device.

Figure 2:
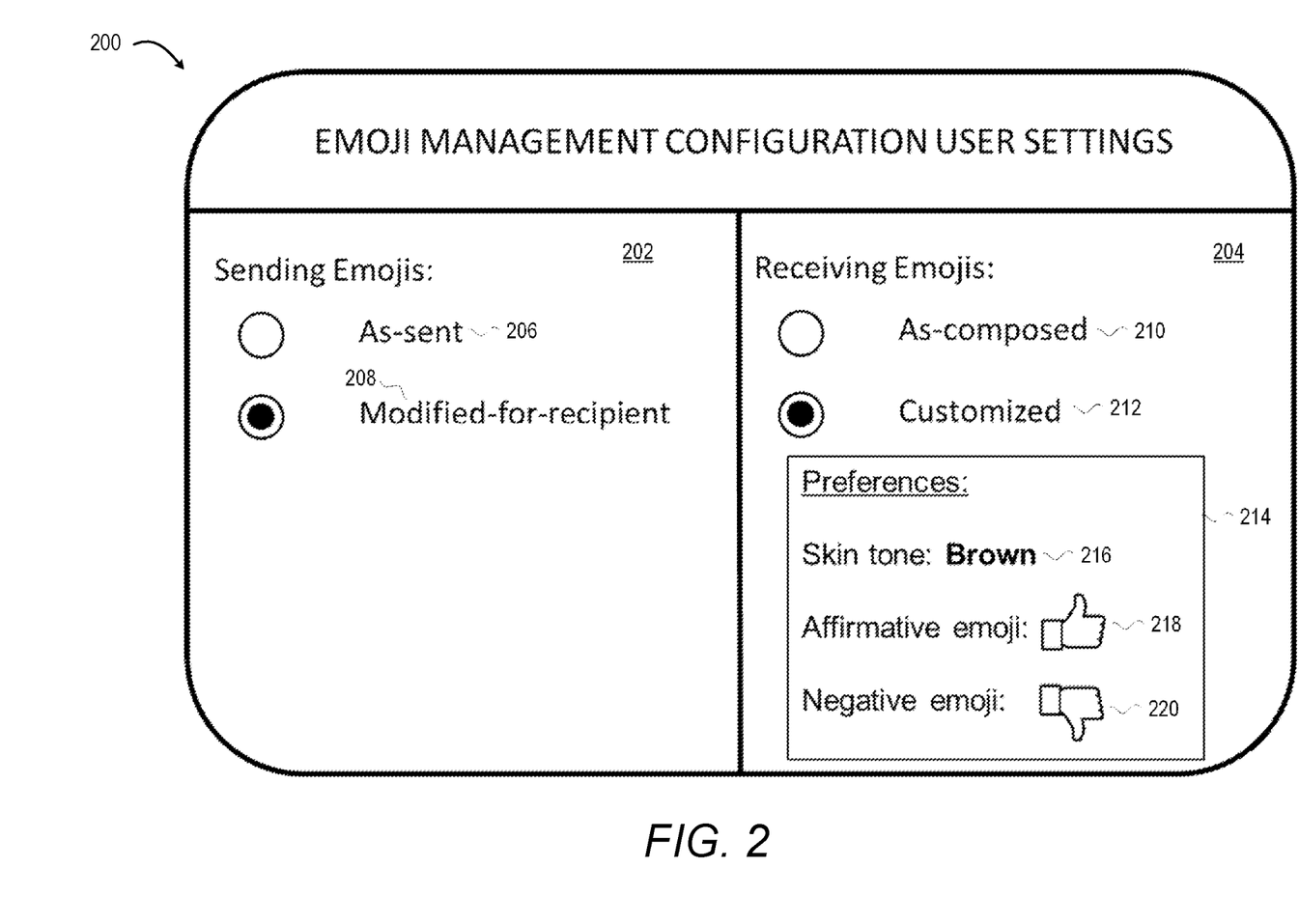
FIG. 2 is an exemplary user interface for emoji management configuration, according to one or more embodiments.

FIG. 2 is an exemplary user interface 200 for emoji management configuration, according to one or more embodiments. User interface 200 includes a sender option section 202. The sender option section 202 includes multiple radio buttons. A first radio button enables an as-sent option 206. A second radio button enables a modified-for-recipient option 208. When the as-sent option 206 is selected, the as-sent option 206 causes the processor of an electronic device to send a message to one or more recipients using emoji(s) selected by the sender as he/she composed the message. When the modified-for-recipient option 208 is selected (as shown in FIG. 2), the modified-for-recipient option 208 causes the processor of an electronic device to send a message to one or more recipients based on emoji preferences of the recipient(s), if such preferences are available. Thus, when the modified-for-recipient option 208 is selected, the option (208) serves as an emoji override function, in that if a recipient preference exists for a given type of emoji, then that preference overrides what the sender has selected. If no corresponding recipient preference exists for the given emoji selected by the sender, then the message is sent using the emoji selected by the sender. Thus, the message is received 'as-sent' (as composed) if there is no recipient preference set which would override the emoji(s) that were selected by the sender during composition of the message. In one or more embodiments, the sender options shown in section 202 are saved in a user profile within system memory (120 of FIG. 1). In one or more embodiments, emoji reception preferences for different users may be stored in the contact database (153 of FIG. 1) of an electronic device. Accordingly, in one or more embodiments, prior to sending an electronic message, a processor of the sending device can check each included emoji against emoji reception preferences of the recipient(s) in the contact database, and modify the emojis in the outgoing message based on the sender-selected emoji and the sender/recipient user preferences.

User interface 200 further includes a recipient option section 204. The recipient option section 204 includes multiple radio buttons. A first radio button option enables an as-composed option 210. A second radio button enables a customized (modified-for-recipient) option 212. When the as-composed option 210 is selected, the processor of an electronic device receiving a message containing one or more emojis presents the message, along with the emojis selected by the sender on the display of the recipient's electronic device. When the customized (modified-for-recipient) option 212 is selected (as shown in FIG. 2), the processor of an electronic device receiving an electronic message containing emojis modifies one or more emoji attributes and/or replaces the sender emoji with a different emoji prior to presenting the message to the recipient. The user interface 200 further includes a recipient preferences section 214. The recipient preferences section 214 can include a variety of user-preferences, including, but not limited to, a preferred skin tone 216 for applicable emojis, an approved affirmative emoji 218, and/or a preferred negative emoji 220. Some emojis may not have an applicable attribute. In the case where an emoji does not have an applicable attribute, then the emoji is presented as originally sent. As an example, if a user includes a basketball emoji in an outgoing electronic message, since the attributes of skin tone, affirmative, and negative, do not apply to a basketball, no changes are made to a basketball emoji based on the preferences specified in recipient preferences section 214 of FIG. 2. However, if an emoji that includes a human hand is sent, then the skin tone attribute applies. Accordingly, given the example setting at 216, if an emoji with a yellow skin tone is received, disclosed embodiments change the emoji and/or attribute, such that the recipient receives the message with the brown skin tone that is the recipient's preference, based on the option set at 216. In the aforementioned example, a basketball emoji is an example of a non-configurable emoji, whereas a thumbs-up emoji is an example of a configurable emoji, as the thumbs-up emoji includes at least one changeable attribute (skin tone).

Figure 3:
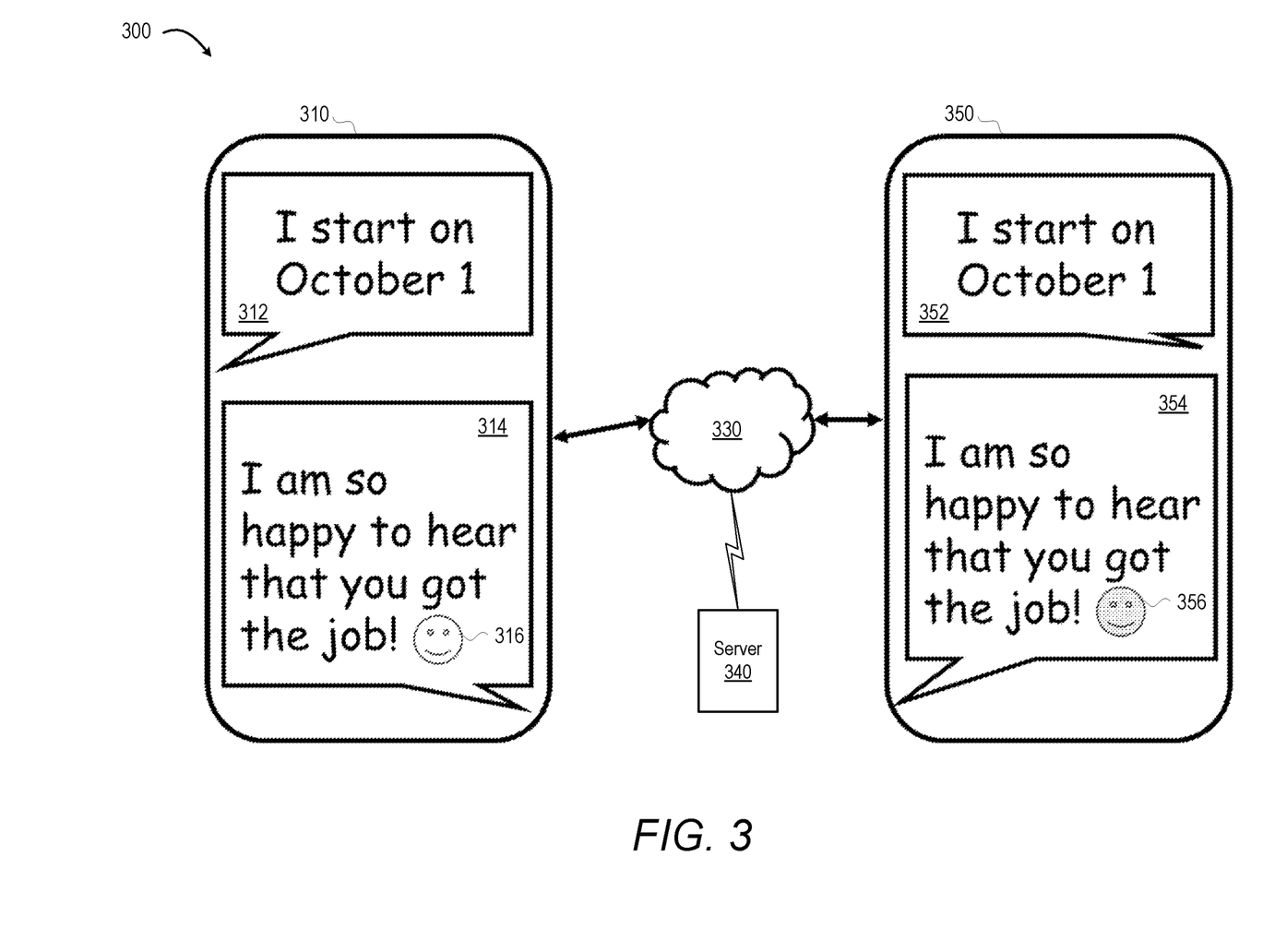
FIG. 3 shows an exemplary communication that includes an automatic emoji skin tone attribute change, according to one or more embodiments.

One or more embodiments can include changing the skin tone attribute for the emoji. FIG. 3 shows an exemplary communication that includes an automatic emoji skin tone attribute change, according to one or more embodiments. In the example 300, an electronic device 310 corresponds to a first user and another electronic device 350 corresponds to a different user. Device 310 and device 350 can be implementations of electronic device 100, having similar components and/or functionality. The example 300 depicts a communication exchange between the electronic device 310 and the electronic device 350, which takes place via communication network 330. In one or more embodiments, communication network 330 can include, but is not limited to, the Internet, a cellular communication network, a WiFi network, and/or any combination of aforementioned networks and/or other suitable networks that are sufficient to enable exchange of communication between electronic device 310 and electronic device 350.

The conversation starts with the electronic device 350 sending a message indicated at 352, which is received by electronic device 310 and displayed at 312. The electronic device 310, in response, sends a message indicated at 314 and includes an emoji 316. Emoji 316 is a smiley face emoji having an attribute of a light skin tone. The message is sent to the electronic device 350 which receives and displays the message at 354. However, the recipient preferences are set to indicate a darker skin tone preference (see, for example, 216 of FIG. 2), so the emoji 356 presented in message at 354 has a darker skin tone than the emoji 316 that was selected by the sender. In this example, the type of emoji is unchanged (smiley face), but the skin tone attribute of the emoji is changed prior to rendering the message on the electronic device 350. In embodiments, emoji attribute changes can be performed on the sending device 310, the recipient device 350, and/or an external server 340 that is also accessible to the sending device 310 and recipient device 350 via network 330.

Figure 4:
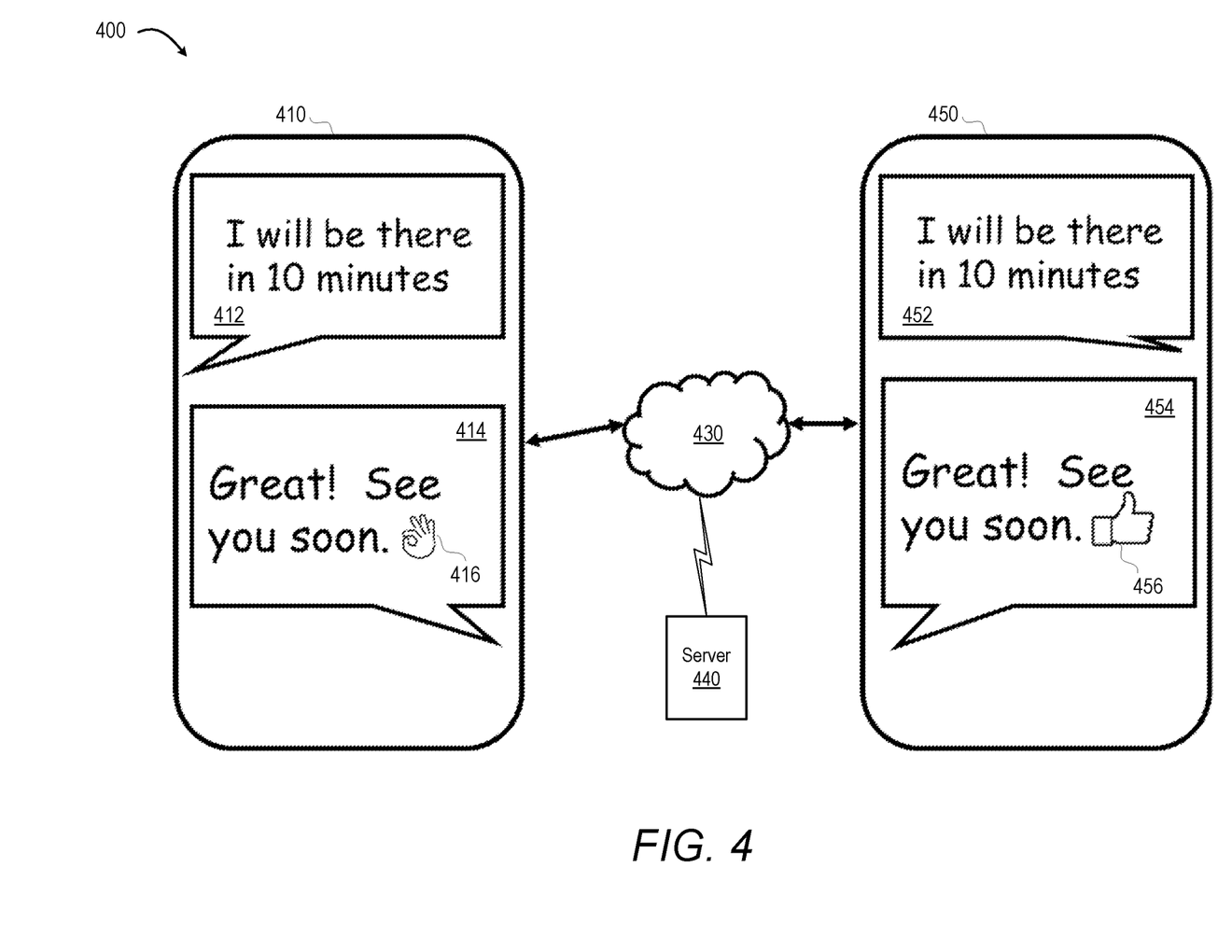
FIG. 4 shows an exemplary communication that includes an automatic emoji gesture attribute change, according to one or more embodiments.

One or more embodiments can include changing the gesture attribute for the emoji. FIG. 4 shows an exemplary communication that includes an automatic emoji gesture attribute change, according to one or more embodiments. In the example 400, an electronic device 410 corresponds to a first user, and another electronic device 450 corresponds to a different user. Device 410 and device 450 can be implementations of electronic device 100, having similar components and/or functionality. The example 400 depicts a communication exchange between the electronic device 410 and the electronic device 450, which takes place via communication network 430. In one or more embodiments, communication network 430 can include, but is not limited to, the Internet, a cellular communication network, a WiFi network, and/or any combination of aforementioned networks and/or other suitable networks that are sufficient to enable communication between electronic device 410 and electronic device 450.

The conversation starts with the electronic device 450 sending a message indicated at 452, which is received by electronic device 410 and displayed at 412. The electronic device 410, in response, sends a message indicated at 414, and includes an emoji 416. Emoji 416 is an "OK" hand gesture emoji having an attribute of a light skin tone. The message is sent to the electronic device 450 which receives and displays the message at 454. However, as the recipient preferences are set to indicate a thumbs up emoji for affirmative sentiment (see 218 of FIG. 2), the emoji 456 presented in message 454 shows a thumbs-up gesture attribute instead of the 'OK' attribute of emoji 416 that was selected by the sender. In this example, the skin tone attribute of the emoji is unchanged (light tone), but the gesture attribute of the emoji is changed prior to rendering the message on the electronic device 450. In embodiments, emoji attribute changes can be performed on the sending device 410, the recipient device 450, and/or an external server 440 that is also accessible to the sending device 410 and recipient device 450 via network 430.

Figure 5:
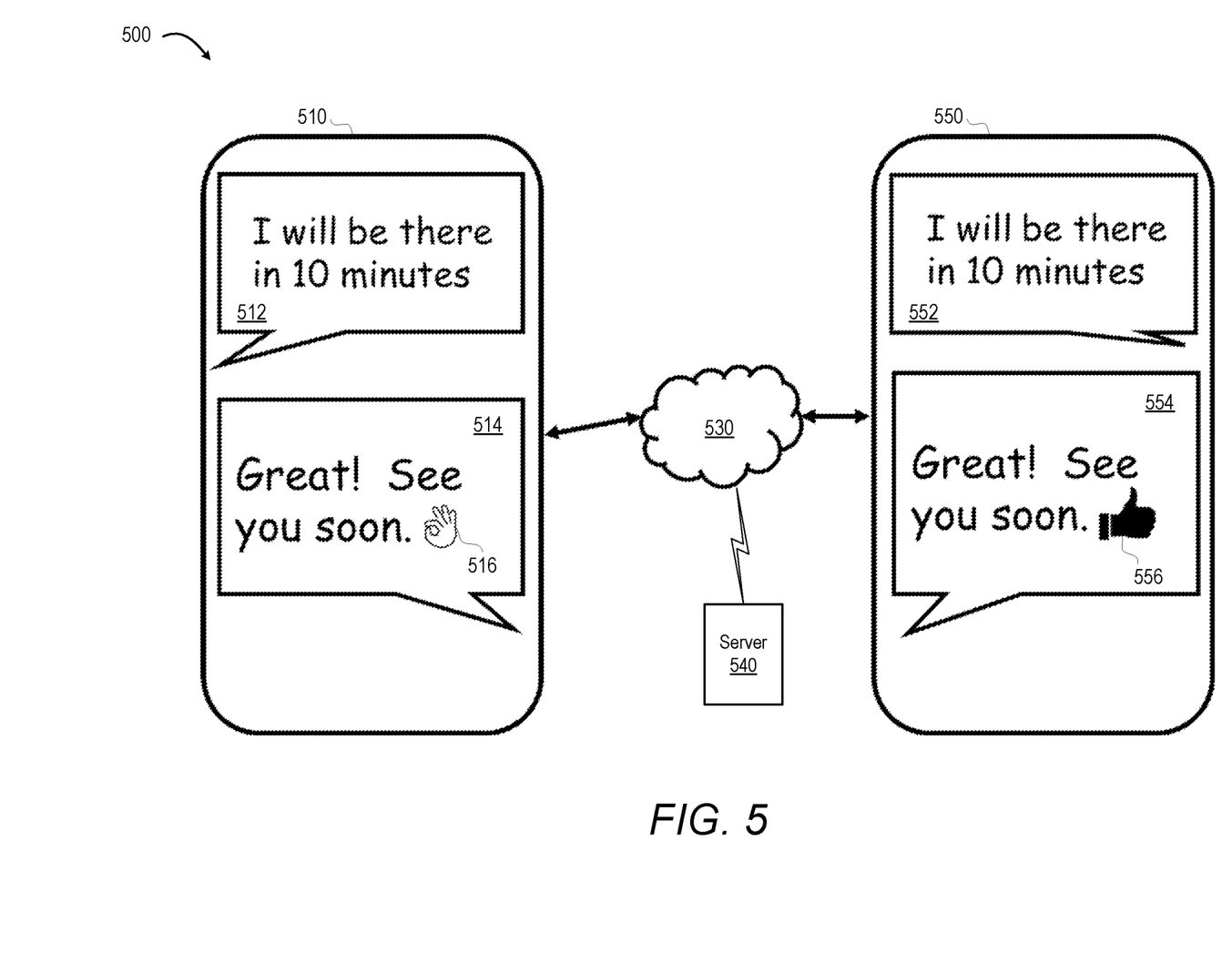
FIG. 5 shows an exemplary communication that includes both an automatic emoji skin tone attribute change and an automatic emoji gesture attribute change, according to one or more embodiments.

FIG. 5 shows an exemplary communication that includes an automatic emoji gesture attribute change, according to one or more embodiments. In the example 500, an electronic device 510 corresponds to a first user, and another electronic device 550 corresponds to a different user. Device 510 and device 550 can be implementations of electronic device 100, having similar components and/or functionality. The example 500 depicts a communication exchange between the electronic device 510 and the electronic device 550, which takes place via communication network 530. In one or more embodiments, communication network 530 can include, but is not limited to, the Internet, a cellular communication network, a WiFi network, and/or any combination of aforementioned networks and/or other suitable networks that are sufficient to enable communication between electronic device 510 and electronic device 550.

The conversation starts with the electronic device 550 sending a message indicated at 552, which is received by electronic device 510 and displayed at 512. The electronic device 510, in response, sends a message indicated at 514 and includes an emoji 516. Emoji 516 is an "OK" hand gesture emoji having an attribute of a light skin tone. The message is sent to the electronic device 550 which receives and displays the message at 554. However, as the recipient preferences are set to indicate a thumbs up emoji for affirmative sentiment (see 218 of FIG. 2) as well as a darker skin tone (see 216 of FIG. 2), the emoji 556 presented in message 554 shows a thumbs-up gesture attribute instead of the 'OK' attribute of emoji 416 that was selected by the sender, as well as rendering the emoji 556 using a dark skin tone. In this example, both the skin tone attribute of the emoji is changed (light tone in emoji 516 on sending device is rendered on receiving device with darker tone in emoji 556), and also, the gesture attribute of the emoji is changed from an OK gesture in the sender message shown at 516 to a thumbs-up emoji 556 in the received message 554, prior to rendering the message on the electronic device 550. In one or more embodiments, modifying the emoji based on the one or more attributes comprises modifying the emoji based on one or more of a gesture attribute and a skin tone attribute. In embodiments, emoji attribute changes can be performed on the sending device 510, the recipient device 550, and/or an external server 540 that is also accessible to the sending device 510 and recipient device 550 via network 530.

Figure 6:
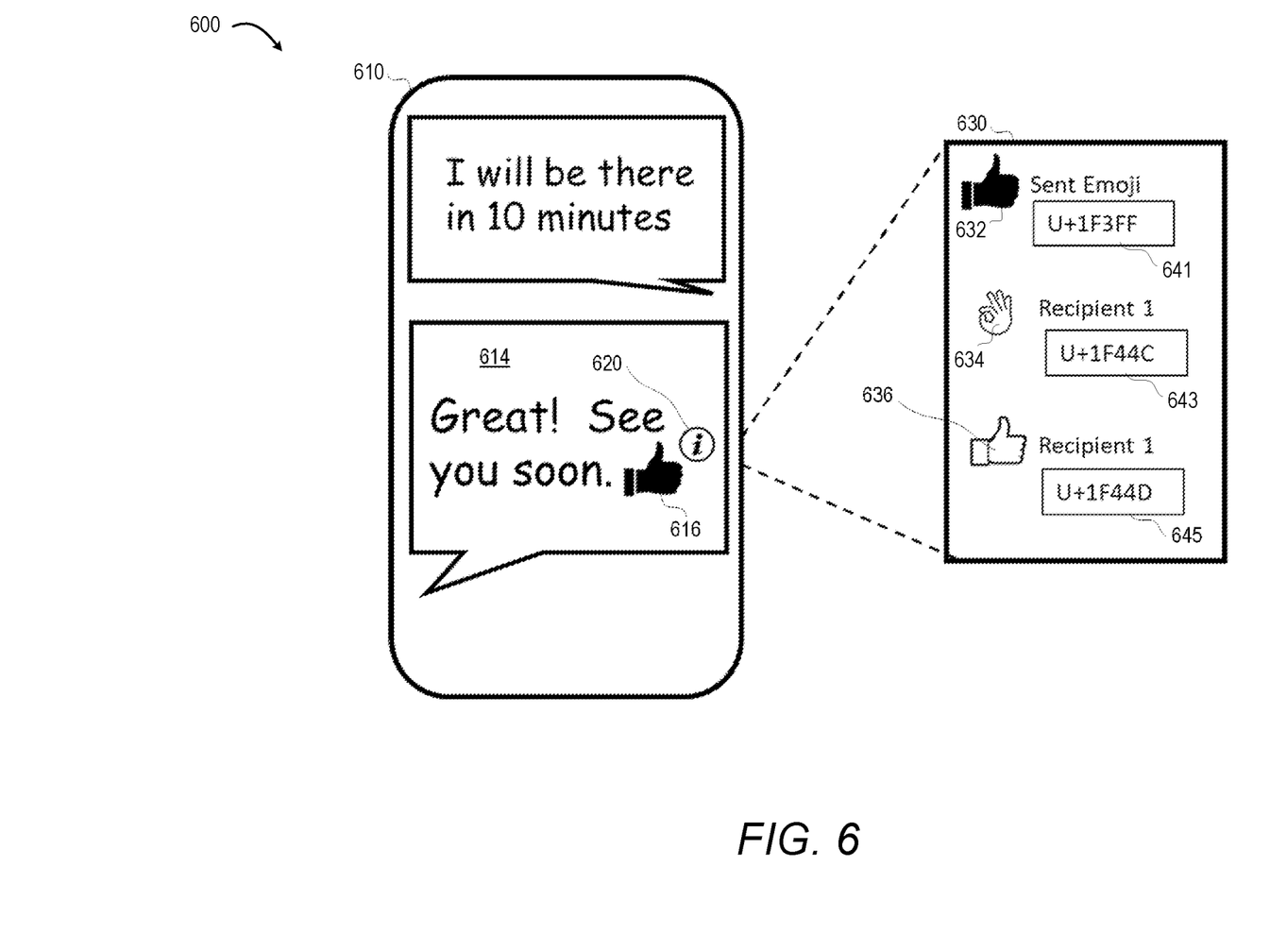
FIG. 6 shows an exemplary user interface for determining a received emoji, according to one or more embodiments.

FIG. 6 shows an exemplary user interface that supports determining a received emoji, according to one or more embodiments. In the example 600, an electronic device 610 corresponds to a user sending a message. Device 610 can be an implementation of electronic device 100, having similar components and/or functionality. As shown in FIG. 6, there is a composed message 614 that includes a sender-selected emoji 616. Adjacent to the emoji 616 is a virtual information (or query) button 620. Upon invocation of the virtual information button 620 (e.g., via tap, swipe, mouse click, or other suitable technique), the processor within device 610 presents an emoji information details user interface 630. The emoji information details (EID) user interface 630 can include additional information about an emoji, including, but not limited to, what emoji was selected by the sender of a message, and/or what emoji was received by recipient(s) of a message. EID user interface 630 indicates a sender-selected emoji at 632, and can indicate a recipient-received emoji for one or more recipients of the message. In the example 600, there are two recipient emojis, each corresponding to a different recipient of a group message. Emoji 634 is presented to recipient 1, and emoji 634 is presented to recipient 2. Emoji 634 represents a change in both skin tone attribute and gesture attribute as compared to the sender-selected emoji 632. Emoji 636 represents a change in skin tone attribute as compared to the sender-selected emoji 632, while the gesture attribute of the sender-selected emoji 632 is preserved in emoji 636 presented to recipient 2. In one or more embodiments, additional information can be displayed in emoji information details user interface 630, including, but not limited to, which preferences caused a particular emoji to be presented to a recipient, and/or a Unicode representation of sender-selected emojis and/or emojis presented to recipients. In EID user interface 630, Unicode representation 641 corresponds to the sender-selected emoji 632, Unicode representation 643 corresponds to emoji 634, and Unicode representation 645 corresponds to emoji 636. Accordingly, the feature of disclosed embodiments depicted in FIG. 6 can help users to better understand the emoji preferences of those with whom they communicate. In one or more embodiments, in an emoji information details user interface 630, a sender may be able to see what emojis each recipient of a message received. However, in one or more embodiments, in an emoji information details user interface 630, a recipient may only be able to see what emoji was selected by the sender, but may not be able to see what emoji other recipients of the same message received.

Figure 7:
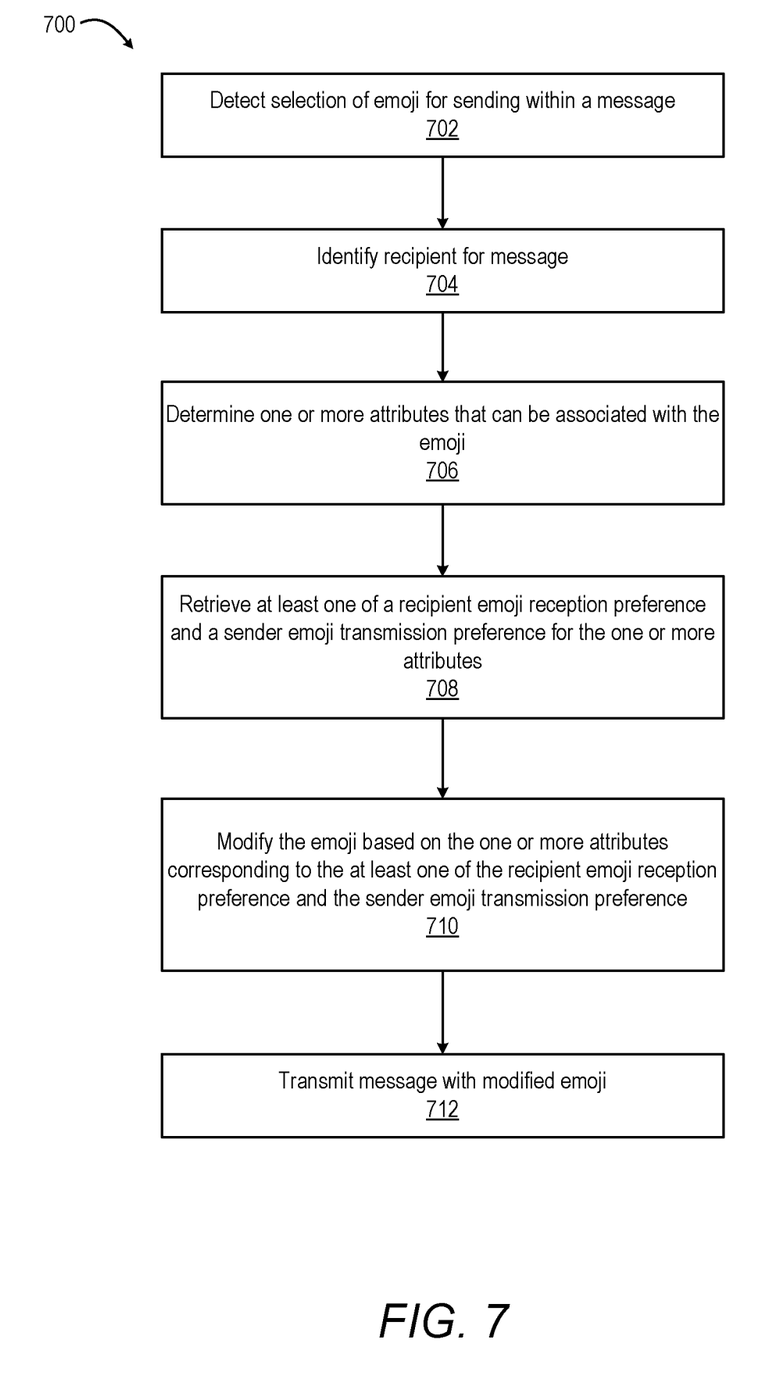
FIG. 7 depicts a flowchart of a method for performing automatic emoji modification, according to one or more embodiments.
Figure 8:
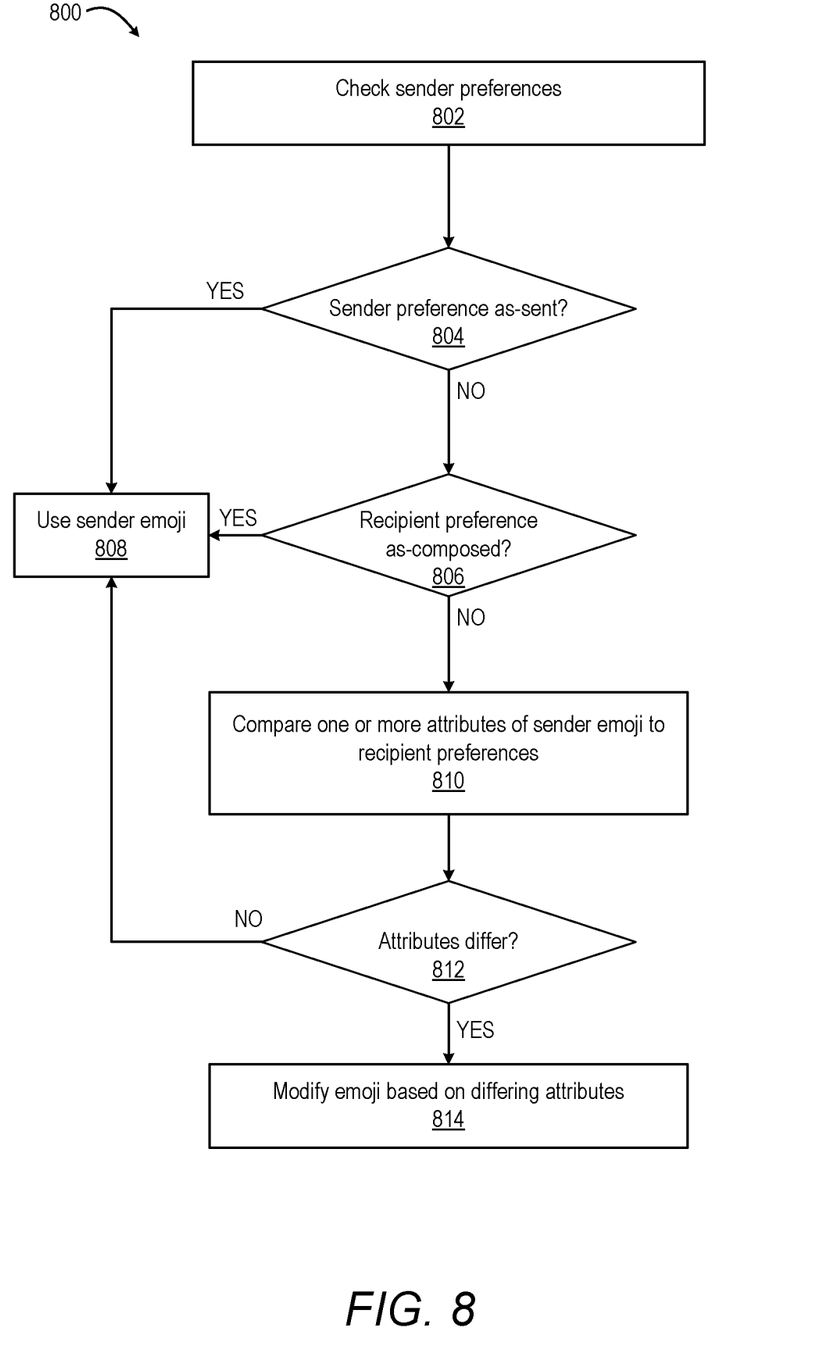
FIG. 8 depicts a flowchart of a method for using sender and/or recipient preferences as criteria for emoji modification, according to one or more embodiments.
Figure 9:
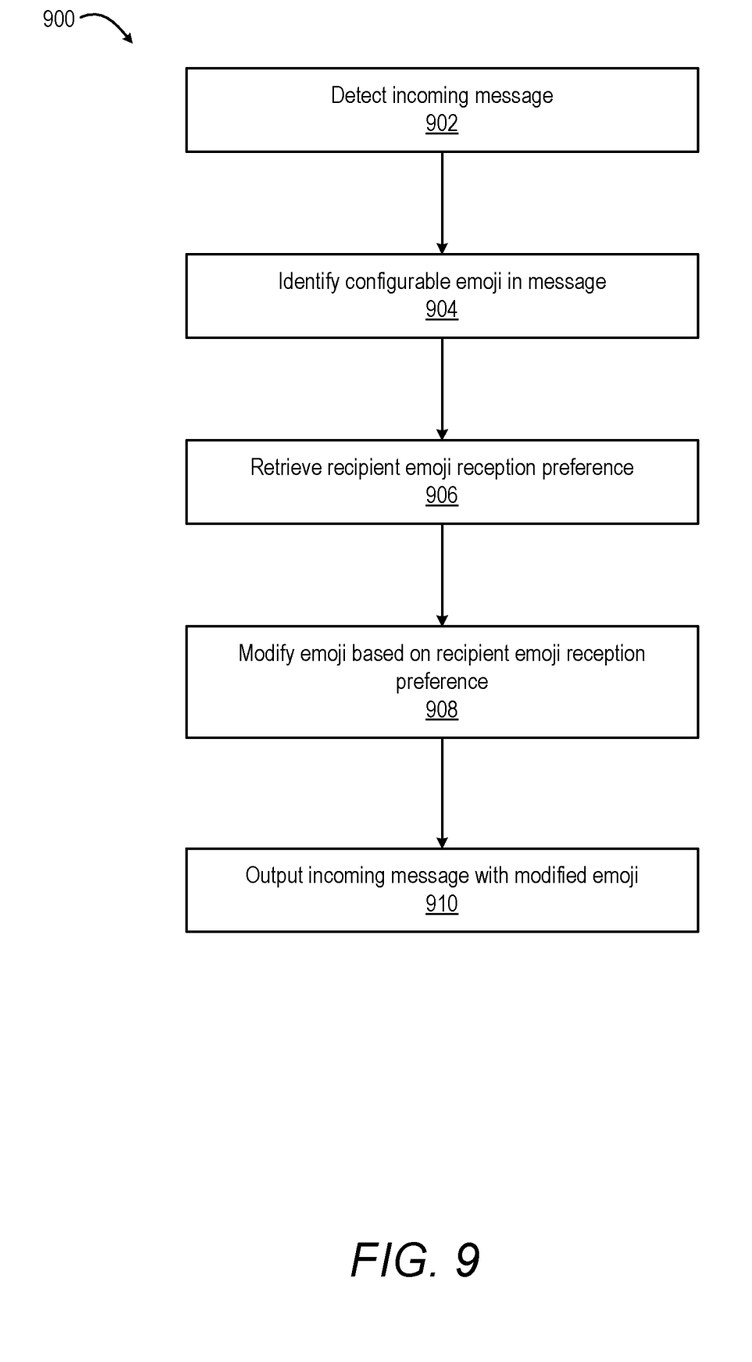
FIG. 9 depicts a flowchart of a method for modifying an emoji included in a received message, according to one or more embodiments.

Referring now to the flowcharts presented by FIGS. 7-9, the descriptions of the methods in FIGS. 7-9 are provided with general reference to the specific components and features illustrated within the preceding FIGS. 1-6. Specific components referenced in the methods of FIGS. 7-9 may be identical or similar to components of the same name used in describing preceding FIGS. 1-6. In one or more embodiments, processor 102 (FIG. 1) configures electronic device 100 (FIG. 1) to provide the described functionality of the methods of FIGS. 7-9 by executing program code for one or more modules or applications provided within system memory 120 of electronic device 100.

FIG. 7 depicts a flowchart of a method 700 for automatic emoji modification, according to one or more embodiments. The method 700 starts at block 702 with detecting selection of an emoji for sending within a message. In one or more embodiments, emojis are represented in electronic messages such as text messages and emails using a Unicode character encoding. Unicode is a standardized character encoding system that assigns a unique numerical code, referred to as a code point, to each character, including emojis. Many emojis are part of the Unicode standard, and each emoji has its own Unicode code point. For example, the "thumbs up" emoji is represented by the Unicode code point U+1F44D, and the "smiling face with tears of joy" emoji is represented by U+1F602. In one or more embodiments, detecting selection of an emoji includes determining a Unicode code point for that emoji to display the emoji on the recipient's electronic device. In one or more embodiments, changing an emoji attribute comprises changing a Unicode code point for an emoji included in a message. The method 700 continues to block 704 where a recipient for the message is identified. In one or more embodiments, there can be multiple recipients. In one or more embodiments, the recipient(s) are identified using an email address, telephone number, username, and/or other suitable identifiers. The method 700 continues to block 706, where one or more attributes that can be associated with the emoji are determined. The attributes can include, but are not limited to, a skin tone, a gesture, a category, a genre, a gender, a meaning, and/or other suitable attributes. In one or more embodiments, the emoji management module (152 of FIG. 1) maintains a list of attributes for one or more emojis. The method 700 continues to block 708 where at least one of a recipient emoji reception preference and a sender emoji transmission preference for the one or more attributes is retrieved. Examples of sender and recipient preferences are shown in FIG. 2. The method 700 continues to block 710, where the emoji is modified based on the one or more attributes corresponding to the at least one of the recipient emoji reception preference and the sender emoji transmission preference. The method 700 continues to block 712, where the message is transmitted using the modified emoji. To illustrate an example of the sender-side emoji modification depicted in method 700, referring again to FIG. 3, a processor on device 310 can modify the message 314 prior to sending the message, such that the message sent from device 310 includes the emoji indicated at 356, even though the sender composed message 314 using emoji 316.

One or more embodiments can include: detecting, by a processor of an electronic device, selection of an emoji for sending within a message; identifying a recipient for the message; determining one or more attributes that can be associated with the emoji; retrieving at least one of a recipient emoji reception preference and a sender emoji transmission preference for the one or more attributes; modifying the emoji based on the one or more attributes corresponding to the at least one of the recipient emoji reception preference and the sender emoji transmission preference; and transmitting the message with the modified emoji to the recipient.

One or more embodiments further include determining an identifier for the recipient based on a message destination data field. Retrieving the recipient emoji reception preferences, further includes: obtaining a recipient profile for the recipient based on the identifier; and obtaining an emoji reception preference from the recipient profile, where the emoji reception preference comprises as-composed (as-sent) and modified-for-recipient. In one or more embodiments, retrieving sender emoji transmission preferences comprises: obtaining a user profile associated with the electronic device; and obtaining an emoji transmission preference from the user profile, where the emoji transmission preference comprises as-sent and modified-for-recipient.

FIG. 8 depicts a flowchart of a method 800 for using sender and/or recipient preferences as criteria for emoji modification, according to one or more embodiments. The method 800 starts with block 802, where sender preferences are checked. Examples of sender preferences are shown in 202 of FIG. 2. The method continues to block 804, where a check is made to determine if the sender preference is as-sent (see 206 of FIG. 2). If, at block 804, a determination is made that the sender preference is as-sent, then the method 800 continues to block 808, where the sender-selected emoji is used for the outgoing message. If instead, at block 804, a determination is made that the sender preference is not as-sent (see 208 of FIG. 2), then the method 800 continues to block 806, where the recipient preference, if available, is checked to determine if the recipient preference is set to as-composed (e.g., via contact database 153 of FIG. 1). If, at block 806, a determination is made that the recipient preference is set to as-composed, then the method 800 continues to block 808, where the sender-selected emoji is used for the outgoing message. If instead, at block 806, a determination is made that the recipient preference is not set to as-composed (e.g., via contact database 153 of FIG. 1), then the method 800 continues to block 810, where one or more attributes of the sender emoji are compared to recipient preferences. In one or more embodiments, the attribute settings may be stored as enumerated values in memory (120 of FIG. 1). If the enumerated values of the sent emoji do not match recipient preferences, then a mismatch is detected. As an example of a mismatch, the sender emoji may include a hand gesture with a yellow skin tone, while the recipient preference for emojis may be for hand gestures to appear with a brown skin tone. The method 800 continues to block 812 to determine if the attributes differ. If, at block 812, a determination is made that the attributes do not differ, then the method 800 continues to block 808, where the sender-selected emoji is used for the outgoing message. If instead, at block 812, a determination is made that the attributes differ, then the method 800 continues to block 814, where the emoji is modified based on differing attributes. Examples of emoji modification are shown in at least FIG. 3 (356), FIG. 4 (456), and FIG. 5 (556).

In one or more embodiments, the method 800 can be repeated for each recipient in a group message. As an example, if a sender includes an emoji in a message that is sent to two recipients, each recipient may receive different emojis in the message, based on individual recipient preferences. In one or more embodiments, the recipient is a first recipient among a plurality of recipients comprising at least a second recipient, each of the first recipient and the second recipient having different identifiers and recipient profiles, and the second recipient having a second modified-for-recipient emoji reception preference. The method 800 further includes transmitting to each of the first recipient and the second recipient a version of the message containing a respective one of the modified-for-recipient emoji and the second modified-for-recipient emoji.

FIG. 9 depicts a flowchart of a method 900 for modifying an emoji included in a received message, according to one or more embodiments. The method 900 starts with detecting an incoming message at block 902. The method 900 continues with identifying a configurable emoji in the incoming message at block 904. The method 900 continues with retrieving a recipient emoji reception preference at block 906. Example recipient emoji reception preferences are shown at 204 of FIG. 2. The method 900 continues with modifying an emoji based on a recipient emoji reception preference at block 908. The method 900 continues with outputting the incoming message with the modified emoji at block 910. To illustrate an example of the recipient-side emoji modification depicted in method 900, referring again to FIG. 4, a processor on device 450 can modify a received message prior to displaying the message as shown at 454, such that the message 414 sent from device 410 is received by the processor in device 450 and the processor of device 450 changes the sender-selected emoji (indicated at 416) to the emoji indicated at 456, even though the device received message 414 that includes sender-selected emoji 416.

In one or more embodiments, the method 900 includes: detecting receipt of an incoming message from a sender at a second device; identifying a configurable emoji within the incoming message; retrieving a second recipient emoji reception preference, from a user profile associated with a user of the electronic device; modifying the configurable emoji based on the second recipient emoji reception preference; and outputting the incoming message with the configurable emoji modified based on the second recipient emoji reception preference.

As can now be appreciated, the disclosed embodiments provide emoji management for electronic messaging. Disclosed embodiments enable setting and retrieving of sender and/or recipient emoji preferences. One or more embodiments enable recipients to receive emojis according to their preferred emoji attributes, including, but not limited to, gesture attributes, skin tone attributes, and/or other attributes. Accordingly, problems associated with inadvertently sending an emoji that is not well-received can be mitigated with disclosed embodiments.

In the above-described methods, one or more of the method processes may be embodied in a computer readable device containing computer readable code such that operations are performed when the computer readable code is executed on a computing device. In some implementations, certain operations of the methods may be combined, performed simultaneously, in a different order, or omitted, without deviating from the scope of the disclosure. Further, additional operations may be performed, including operations described in other methods. Thus, while the method operations are described and illustrated in a particular sequence, use of a specific sequence or operations is not meant to imply any limitations on the disclosure. Changes may be made with regards to the sequence of operations without departing from the spirit or scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object-oriented programming language, without limitation. These computer program instructions may be provided to a processor of a general-purpose computer, special-purpose computer, or other programmable data processing apparatus to produce a machine that performs the method for implementing the functions/acts specified in the flowchart and/or block diagram block or blocks. The methods are implemented when the instructions are executed via the processor of the computer or other programmable data processing apparatus.

As will be further appreciated, the processes in embodiments of the present disclosure may be implemented using any combination of software, firmware, or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device can include the following: a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible medium that can contain or store a program for use by or in connection with an instruction execution system, apparatus, or device.

Where utilized herein, the terms "tangible" and "non-transitory" are intended to describe a computer-readable storage medium (or "memory") excluding propagating electromagnetic signals, but are not intended to otherwise limit the type of physical computer-readable storage device that is encompassed by the phrase "computer-readable medium" or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

As used herein, the term "or" is inclusive unless otherwise explicitly noted. Thus, the phrase "at least one of A, B, or C" is satisfied by any element from the set {A, B, C} or any combination thereof, including multiples of any element.

While the disclosure has been described with reference to example embodiments, it will be understood by those skilled in the art that various changes may be made and equivalents may be substituted for elements thereof without departing from the scope of the disclosure. In addition, many modifications may be made to adapt a particular system, device, or component thereof to the teachings of the disclosure without departing from the scope thereof. Therefore, it is intended that the disclosure not be limited to the particular embodiments disclosed for carrying out this disclosure, but that the disclosure will include all embodiments falling within the scope of the appended claims.

What is claimed is:

1. An electronic device comprising:
   a display;
   a memory having stored thereon at least one messaging application and an emoji management module for including instructions for controlling the electronic device;
   a network interface which enables the electronic device to connect to, and exchange messages with, at least one second electronic device; and
   a processor communicatively coupled to the display, the memory, and the network interface, and which executes program code of the at least one messaging application and the emoji management module, which causes the electronic device to:
   detect selection of an emoji for sending within a message;
   identify, from a message destination data field, a recipient for the message;

determine one or more attributes that can be associated with the selected emoji;

retrieve at least one of a recipient emoji reception preference and a sender emoji transmission preference for the determined one or more attributes;

modify the selected emoji based on the determined one or more attributes corresponding to the at least one of the recipient emoji reception preference and the sender emoji transmission preference to generate a modified emoji; and transmit the message with the modified emoji to the identified recipient wherein the modified emoji is presented on a display of a recipient electronic device, while the selected emoji, which presents at least one different attribute from the modified emoji, is presented on the display of the electronic device.

2. The electronic device of claim 1, wherein:

to retrieve the recipient emoji reception preference, the processor:
   obtains a recipient profile for the identified recipient based on a determined identifier; and
   obtains an emoji reception preference from the obtained recipient profile, wherein the emoji reception preference comprises as-composed and modified-for-recipient.

3. The electronic device of claim 2, wherein:

the identified recipient is a first recipient among a plurality of recipients comprising a second recipient, each of the first recipient and the second recipient having different identifiers and recipient profiles, the second recipient having a second modified-for-recipient emoji reception preference; and the processor transmits to the first recipient a version of the message containing the modified-for-recipient emoji and concurrently transmits to the second recipient a different version of the message containing the second modified-for-recipient emoji.

4. The electronic device of claim 1, wherein to retrieve sender emoji transmission preferences, the processor:
   obtains a user profile associated with the electronic device; and
   obtains an emoji transmission preference from the obtained user profile, wherein the obtained emoji transmission preference comprises as-sent and modified-for-recipient.

5. The electronic device of claim 1, wherein the determined one or more attributes for the modified selected emoji comprises a gesture attribute change based on cultural differences between a sender of the selected emoji and a recipient of the selected emoji.

6. The electronic device of claim 1, wherein the determined one or more attributes for the selected emoji comprises a skin tone attribute and to modify the selected emoji, the processor changes the skin tone attribute of a selected gesture.

7. The electronic device of claim 1, wherein the determined one or more attributes for the selected emoji comprises a gesture attribute and to modify the selected emoji, the processor changes the gesture attribute from a first gesture to a second different gesture.

8. The electronic device of claim 1, wherein the determined one or more attributes for the modified selected emoji comprises both a gesture attribute and a skin tone attribute and to change the selected emoji, the processor changes both the gesture attribute and the skin tone attribute.

9. The electronic device of claim 1, wherein further the processor:

detects receipt of an incoming message from a sender at a second device;

identifies a configurable emoji within the incoming message;

retrieves a second recipient emoji reception preference from a user profile associated with a user of the electronic device;

modifies the identified configurable emoji based on the retrieved second recipient emoji reception preference; and outputs the incoming message with the identified configurable emoji modified based on the retrieved second recipient emoji reception preference.

10. A method comprising:

detecting, by a processor of an electronic device, selection of an emoji for sending within a message;

identifying, from a message destination data field, a recipient for the message;

determining one or more attributes that can be associated with the selected emoji;

retrieving at least one of a recipient emoji reception preference and a sender emoji transmission preference for the determined one or more attributes;

modifying the selected emoji based on the determined one or more attributes corresponding to the at least one of the recipient emoji reception preference and the sender emoji transmission preference to generate a modified emoji; and transmitting the message with the modified emoji to the identified recipient wherein the modified emoji is presented on a display of a recipient electronic device, while the selected emoji, which presents at least one different attribute from the modified emoji, is presented on the display of the electronic device.

11. The method of claim 10, wherein:

retrieving the recipient emoji reception preferences further comprises:
   obtaining a recipient profile for the identified recipient based on a determined identifier; and
   obtaining an emoji reception preference from the obtained recipient profile, wherein the emoji reception preference comprises as-composed and modified-for-recipient.

12. The method of claim 11, wherein:

the identified recipient is a first recipient among a plurality of recipients comprising a second recipient, each of the first recipient and the second recipient having different identifiers and recipient profiles, the second recipient having a second modified-for-recipient emoji reception preference; and the method further comprises transmitting to the first recipient a version of the message containing the modified-for-recipient emoji and concurrently transmitting to the second recipient a different version of the message containing the second modified-for-recipient emoji.

13. The method of claim 10, wherein retrieving sender emoji transmission preferences comprises:
   obtaining a user profile associated with the electronic device; and
   obtaining an emoji transmission preference from the obtained user profile, wherein the obtained emoji transmission preference comprises as-sent and modified-for-recipient.

14. The method of claim 10, wherein modifying the selected emoji based on the determined one or more attributes comprises modifying the selected emoji based on a gesture attribute change, which is based on cultural differences between a sender of the selected emoji and a recipient of the selected emoji.

15. The method of claim 10, further comprising changing a skin tone attribute for the selected emoji.

16. The method of claim 10, further comprising changing a gesture attribute for the modified selected emoji from a first gesture to a second different gesture.

17. The method of claim 10, further comprising changing both a gesture attribute for the selected emoji and a skin tone attribute for the selected emoji.

18. The method of claim 10, further comprising:
  detecting receipt of an incoming message from a sender at a second device;
  identifying a configurable emoji within the incoming message;
  retrieving a second recipient emoji reception preference from a user profile associated with a user of the electronic device;
  modifying the identified configurable emoji based on the retrieved second recipient emoji reception preference; and
  outputting the incoming message with the identified configurable emoji modified based on the retrieved second recipient emoji reception preference.

19. A computer program product comprising a non-transitory computer readable medium having program instructions that when executed by a processor of an electronic device, configure the electronic device to perform functions comprising:
  detecting, by the processor, selection of an emoji for sending within a message;
  identifying, from a message destination data field, a recipient for the message;
  determining one or more attributes that can be associated with the selected emoji;
  retrieving at least one of a recipient emoji reception preference and a sender emoji transmission preference for the determined one or more attributes;
  modifying the selected emoji based on the determined one or more attributes corresponding to the at least one of the recipient emoji reception preference and the sender emoji transmission preference to generate a modified emoji; and
  transmitting the message with the modified emoji to the identified recipient wherein the modified emoji is presented on a display of a recipient electronic device, while the selected emoji, which presents at least one different attribute from the modified emoji, is presented on the display of the electronic device.

20. The computer program product of claim 19, wherein the computer program product further comprises program instructions for:
  detecting receipt of an incoming message from a sender at a second device;
  identifying a configurable emoji within the incoming message;
  retrieving a second recipient emoji reception preference from a user profile associated with a user of the electronic device;
  modifying the identified configurable emoji based on the retrieved second recipient emoji reception preference; and
  outputting the incoming message with the identified configurable emoji modified based on the retrieved second recipient emoji reception preference.

* * * * *